April 19, 1966 P. BAUER 3,246,661

FLUID FLIP-FLOP

Filed Oct. 1, 1963

INVENTOR

PETER BAUER

BY Griffin and Stokes

ATTORNEYS

United States Patent Office 3,246,661
Patented Apr. 19, 1966

3,246,661
FLUID FLIP-FLOP

Peter Bauer, Germantown, Md., assignor to Sperry Rand Corporation, New York, N.Y., a corporation of Delaware Filed Oct. 1, 1963, Ser. No. 313,082
7 Claims. (Cl. 137—81.5)

The present invention relates to pure fluid devices and more particularly to pure fluid flip-flop circuits. This invention provides a pure fluid flip-flop comprising two conventional logical NOR circuits, each NOR circuit having an output connected to a control signal input of the other circuit.

An object of the present invention is to provide a pure fluid bistable device employing two standard NOR circuits, the bistable action being obtained by cross coupling an output of each NOR circuit to a control signal input of the other.

In one embodiment of the invention each NOR circuit takes the form of a pure fluid amplifier having a power stream input channel, first and second output channels and first and second control signal input channels. The control signal input channels terminate at orifices adjacent the path of the power stream so that upon occurrence of a control signal in either channel the corresponding power stream is deflected into the second output channel.

In a second embodiment of the invention each NOR circuit takes the form of a fluid amplifier having a power stream input channel, first and second output channels, and a single control signal input channel, and a passive OR circuit having an output connected to the control signal input channel of the amplifier. In this embodiment the OR circuit has at least one input connected to an output channel of the amplifier in the other NOR circuit.

A further object of the invention is to provide a fluid flip-flop circuit which is reliable in operation and does not switch when back-loaded.

Other objects of the invention and its mode of operation will become apparent upon consideration of the following description and the accompanying drawing in which.

Figure 1:
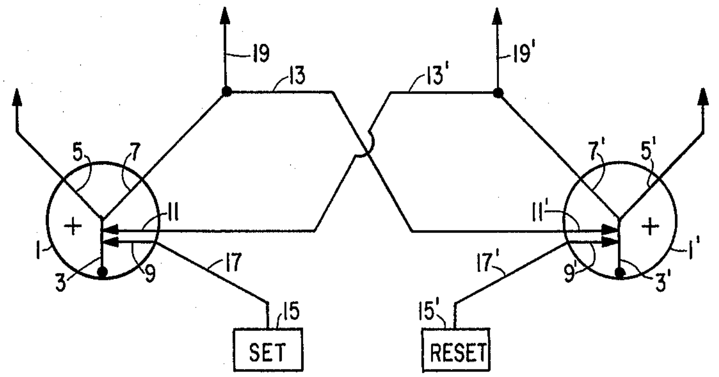
FIGURE 1 is a schematic diagram of a first embodiment of the invention.

Reference is now made to FIGURE 1 wherein a first embodiment of the invention comprises first and second pure fluid amplifier NOR circuits 1 and 1′. Amplifier 1 includes a power stream input channel 3, first and second output channels 5 and 7, and first and second control signal input channels 9 and 11. In like manner, amplifier 1′ includes a power stream input channel 3′, first and second output channels 5′ and 7′, and first and second control signal input channels 9′ and 11′.

Output channel 7 is connected by means of a pipe, duct, channel or other fluid conveying means 13 to control signal input channel 11′ and output channel 7′ is connected by means of a pipe 13′ to control signal input channel 11.

The symbols employed herein correspond to the system of schematic representation presented at pages 437–447 of the publication entitled, "Proceedings of the Fluid Amplification Symposium," volume I, said publication being available through the Office of Technical Services of the Department of Commerce. Accordingly, power stream input channels 3 and 3′ terminate at small black dots which represent a pump, compressor or other means for continuously supplying a stream of fluid at substantially constant pressure.

A source of set signals 15 is connected by means of a pipe 17 to control signal input channel 9 and a source of reset signals 15′ is connected by means of a pipe 17′ to control signal input channel 9′. Sources 15 and 15′ may be any suitable sources for intermittently producing fluid signals and may, for instance, comprise other fluid amplifier logic circuits.

Pipes 19 and 19′ are connected to pipes 13 and 13′ for the purpose of producing output signals indicative of the state of the flip-flop. The flip-flop is considered to be in the set state when a relatively low pressure exists at the output of pipe 19 and a higher pressure exists at the output of pipe 19′. Conversely, the flip-flop is considered to be in the reset state when a relatively low pressure exists at the output of pipe 19′ and a higher pressure exists at the output of pipe 19.

As subsequently explained, amplifiers 1 and 1′ are geometrically biased so that in the absence of any control signals the power streams flow into output channels 7 and 7′. However, a fluid signal applied to channel 9 or channel 11 deflects the power stream of amplifier 1 to output channel 5 and a fluid signal applied to channel 9′ or channel 11′ deflects the power stream of amplifier 1′ to output channel 5′.

Assume that the flip-flop is initially in the reset state. No control signals are being applied to amplifier 1 so the power stream of this amplifier flows through output channel 7, pipe 13, and control signal input channel 11′ thereby deflecting the power stream of amplifier 1′ into output channel 5′. At the same time, a portion of the power stream fluid leaving channel 7 enters pipe 19 to produce a signal indicating that the flip-flop is in the reset state.

The flip-flop remains in the reset state until source 15 produces a fluid set signal. This signal is applied to control signal input channel 9 and deflects the power stream of amplifier 1 into output channel 5. When the power stream of amplifier 1 is diverted away from channel 7 and into channel 5 fluid stops flowing into control signal input channel 11′. Since the power stream is no longer being deflected by the control signal from channel 11′ it returns to its normal state and flows into output channel 7′. The power stream of amplifier 1′ now flows through channels 7′, 13′ and 11 to hold the power stream in its deflected position. The flip-flop is stable under these conditions of flow. That is, after a set pulse is applied the power streams of amplifiers 1 and 1′ flow into channels 5 and 7′ and continue to do so even after the set signal terminates.

The flip-flop remains in the set state until a fluid reset signal is applied to channel 9′. This signal deflects the power stream of amplifier 1′ so that it flows into output channel 5′. Since power stream fluid no longer flows into channel 7′ the control fluid stops flowing in channel 11 thus permitting the power stream of amplifier 1 to return to its normal state and flow into channel 7. The fluid flows through channels 13 and 11′ to hold the power stream of amplifier 1′ in its deflected position. As soon as fluid begins issuing from channel 11′ the reset signal in channel 9′ may be terminated and the flip-flop will remain in its reset state.

From the above description it becomes obvious that the flip-flop has two stable states. It is set in one state in response to a fluid signal from source 15 and remains in that state until source 15′ produces a reset signal. Sources 15 and 15′ must occur alternately in order to change the state of the flip-flop. That is, if two set signals are applied to the flip-flop without an intervening reset signal the first set signal sets the flip-flop but the second set signal has no effect on the flip-flop. If two reset signals are applied to the flip-flop without an intervening set signal the first reset signal resets the flip-flop and the second reset signal has no effect.

Figure 3:
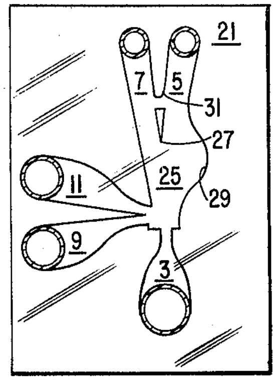
FIGURE 3 shows a NOR circuit suitable for use in one embodiment of the invention.

FIGURE 3 shows a pure fluid NOR circuit suitable for use in the flip-flop described above. The NOR circuit comprises a substantially solid body 21 having formed therein a power stream input channel 3, first and second output channels 5 and 7, and first and second control signal input channels 9 and 11 all connecting with an interaction chamber 23. The amplifier is geometrically biased so that in the absence of a control jet issuing from either channel 9 or channel 11 the power stream flows into output channel 7. This is accomplished by positioning the dividing element 27 such that its tip is offset to the right of the path of the power jet issuing from power stream input channel 3.

If a fluid signal is applied to either control channel 9 or 11, or both control channels simultaneously, a control jet issues from the corresponding control channel and deflects the power stream into output channel 5. As soon as all control jets are terminated the power stream assumes its normal path of flow into channel 7.

Wall 29 is provided with a special curved configuration to improve the switching characteristics of the amplifier and a channel 31 interconnects channels 5 and 7 to prevent switching of the amplifier when it is back-loaded. These features are more fully explained in copending application Serial No. 189,530, filed Apr. 23, 1962.

Figure 2:
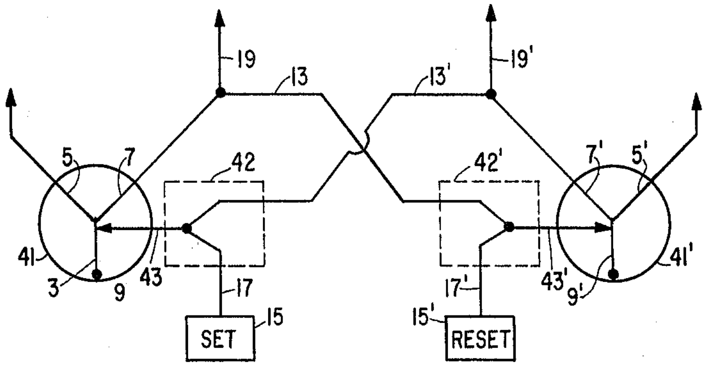
FIGURE 2 is a schematic diagram of a second embodiment of the invention.

FIGURE 2 shows a second embodiment of the invention wherein the flip-flop comprises two inverting amplifiers 41 and 41′ and two passive OR circuits 42 and 42′. Each amplifier may be of the type shown in FIGURE 3 but having only one control signal input channel. In FIGURE 2 these control signal channels bear the reference numerals 9 and 9′.

OR circuit 42 is a flow combining circuit and may, for example, be a Y connection formed by the intersection of pipes 13′ and 17. The output of OR circuit 42 is connected by means of a pipe 43 to control signal input channel 9.

OR circuit 42′ may be formed by the intersection of pipes 13 and 17′ and the output of this circuit is connected by means of a pipe 43′ to control signal input channel 9′.

The flip-flop shown in FIGURE 2 functions in substantially the same manner as that shown in FIGURE 1. The primary difference is that the OR function is performed by elements 42 and 42′ instead of being performed simultaneously with the inversion function in one of the amplifiers. Accordingly, the operation of the circuit shown in FIGURE 2 is believed obvious from the description given above.

In both embodiments the signals developed in output channels 5 and 5′ may be utilized to provide indications of the state of the flip-flop. Alternatively, the channels 5 and 5′ may exhaust into the surrounding environment or be connected to the return side of the source which provides fluid for the power streams.

While NOR circuits of the type shown in FIGURE 3 are admirably suited for use in pure fluid flip-flops and permit highly reliable operation, the present invention in its broadest aspect contemplates the use of pure fluid amplifiers of other types. For example, two vortex amplifiers of the type shown in copending application Ser. No. 135,824 may be interconnected in accordance with the principles of the present invention to form a flip-flop. Other modifications and substitutions falling within the spirit and scope of the invention will be obvious to those skilled in the art. It is intended therefore to be limited only by the scope of the appended claims.

The embodiments of the invention in which an exclusive property or privilege is claimed are defined as follows:

1. A pure fluid flip-flop comprising: first and second pure fluid circuit means, each of said circuit means including means continuously producing a power stream, output channel means for selectively receiving said power stream, and first and second input channel means through which fluid signals may be applied to selectively deflect said power stream away from said output channel; means connecting the output channel of said first circuit to the first input channel of said second circuit and connecting the output channel of said second circuit to the first input channel of said first circuit so that power stream flow into one of said output channels prevents power stream flow into the other of said output channels; means for intermittently applying a fluid set signal to the second input channel of said first circuit to deflect the power stream of said first circuit away from said first output channel means; and means for intermittently applying a fluid reset signal to the second input channel of said second circuit to deflect the power stream of said second circuit away from said second output channel means.

2. A pure fluid flip-flop as claimed in claim 1 wherein said first and second circuit means comprise first and second pure fluid amplifiers for performing the logical NOR function.

3. A pure fluid flip-flop as claimed in claim 1 wherein said first and second circuit means each comprises a fluid amplifier having a single control signal input channel, said first and second input channel means being interconnected with said single control signal input channel whereby a fluid signal flowing through either said first or said second input channel means enters said control signal input channel.

4. A pure fluid flip-flop comprising: first and second pure fluid NOR circuits each having first and second input channels, means for producing a power stream and at least one output channel, the channels of each of said NOR circuits being interconnected in an internal configuration whereby the power stream flows into the output channel only during the time a fluid signal is not applied to either input channel; channel means connecting said one output channel of each NOR circuit to the first input channel of the other NOR circuit; means for applying fluid reset signals to the second input of said second NOR circuit; means for applying fluid set signals to the second input of said first NOR circuit; and means responsive to fluid flow in either of said output channels for producing fluid signals indicative of the state of said flip-flop.

5. A pure fluid flip-flop comprising: first and second pure fluid amplifiers for performing the inversion function; first and second pure fluid circuits for performing the logical OR function, each of said OR circuits having two inputs and an output; fluid conveying means connecting the output of said first fluid amplifier to one input of said second OR circuit and the output of said second fluid amplifier to one input of said first OR circuit; further fluid conveying means for connecting the output of said first OR circuit to said first fluid amplifier and the output of said second OR circuit to said second fluid amplifier; means for intermittently applying set signals to the other input of said first OR circuit; and means for intermittently applying reset signals to the other input of said second OR circuit.

6. A pure fluid flip-flop comprising: first and second pure fluid amplifiers each performing the logical NOR function, each of said amplifiers comprising a power stream input channel, a first output channel for normally receiving a power stream issued from said power stream channel, first and second control signal input channels for selectively directing fluid against said power stream to selectively deflect said power stream away from said first output channel; and a second output channel for receiving said power stream as long as it is being deflected by a signal from one or more of said control signal channels; fluid conveying means connecting the first output channel of said first amplifier to the first control signal input channel of said second amplifier and the first output channel of said second amplifier to the first control signal input channel of said first amplifier; means for intermittently applying fluid set signals to the second control signal input channel of said first amplifier; means for intermittently applying fluid reset signals to the second control signal input channel of said second amplifier; and means responsive to fluid flow in at least one output channel of at least one of said fluid amplifiers for producing a fluid signal indicating the state of said flip-flop.

7. A pure fluid device as claimed in claim 6 and further comprising means for continuously applying fluid power streams to said first and second amplifiers, said first output channels, said fluid conveying means, and said first control signal input channels being dimensioned whereby power stream flow into the first output channel of one amplifier is sufficient to cause deflection of the power stream away from the first output channel of the other amplifier.

References Cited by the Examiner

UNITED STATES PATENTS

| | | | |
|---|---|---|---|
| 3,001,698 | 9/1961 | Warren ---------- | 137—81.5 X |
| 3,075,548 | 1/1963 | Horton ----------- | 137—81.5 X |
| 3,107,850 | 10/1963 | Warren et al. ---- | 137—81.5 X |

FOREIGN PATENTS

| | | |
|---|---|---|
| 1,278,781 | 11/1961 | France. |

OTHER REFERENCES

"The Amateur Scientist," C.L. Stong, Scientific American, vol. 207, No. 2, August 1962, p. 130, top figure. (Copy in Group 360 and Scientific Library.)

"Fluid Logic Devices and Circuits," Mitchell et al., Transactions of the Society of Instrument Technology, Feb. 26, 1963 (I.B.M. publications file copy in Scientific Library and Group 360).

M. CARY NELSON, *Primary Examiner.*

S. SCOTT, *Assistant Examiner.*